(12) United States Patent
Hu et al.

(10) Patent No.: US 11,296,149 B2
(45) Date of Patent: Apr. 5, 2022

(54) DISPLAY SUBSTRATE, DISPLAY PANEL, DISPLAY APPARATUS, AND METHOD OF FABRICATING A DISPLAY SUBSTRATE THEREOF

(71) Applicants: Hefei Xinsheng Optoelectronics Technology Co., Ltd., Anhui (CN); BOE Technology Group Co., Ltd., Beijing (CN)

(72) Inventors: Youyuan Hu, Beijing (CN); Mengyu Luan, Beijing (CN)

(73) Assignees: Hefei Xinsheng Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 233 days.

(21) Appl. No.: 16/626,489

(22) PCT Filed: Feb. 27, 2019

(86) PCT No.: PCT/CN2019/076327
§ 371 (c)(1),
(2) Date: Dec. 24, 2019

(87) PCT Pub. No.: WO2020/113831
PCT Pub. Date: Jun. 11, 2020

(65) Prior Publication Data
US 2021/0335901 A1     Oct. 28, 2021

(30) Foreign Application Priority Data
Dec. 6, 2018 (CN) .......................... 201811488774.8

(51) Int. Cl.
*H01L 27/32* (2006.01)
*H01L 51/50* (2006.01)
(Continued)

(52) U.S. Cl.
CPC ...... *H01L 27/3206* (2013.01); *H01L 27/3246* (2013.01); *H01L 27/3258* (2013.01);
(Continued)

(58) Field of Classification Search
CPC ............. H01L 27/3206; H01L 27/3246; H01L 51/5265; H01L 51/56; H01L 27/3258;
(Continued)

(56) References Cited

U.S. PATENT DOCUMENTS

2002/0185967 A1    12/2002  Friend
2013/0147689 A1     6/2013  Liu et al.
(Continued)

FOREIGN PATENT DOCUMENTS

CN     102610630 A     7/2012
CN     103647026 A     3/2014
(Continued)

OTHER PUBLICATIONS

International Search Report & Written Opinion dated Sep. 5, 2019, regarding PCT/CN2019/076327.
(Continued)

*Primary Examiner* — Moin M Rahman
*Assistant Examiner* — Mohammad A Rahman
(74) *Attorney, Agent, or Firm* — Intellectual Valley Law, P.C.

(57) ABSTRACT

A display substrate having an array of a plurality of subpixels is provided. The display substrate includes a base substrate; a pixel driving layer including a plurality of thin film transistors on the base substrate; a tuning layer on a side of the pixel driving layer away from the base substrate, thicknesses of the tuning layer being different in subpixels of different colors; and a plurality of organic light emitting diodes on a side of the tuning layer away from the pixel driving layer. A respective one of the plurality of organic
(Continued)

light emitting diodes includes a hole injection layer, thicknesses of the hole injection layer being different in subpixels of different colors. The thicknesses of the tuning layer and the thicknesses of the hole injection layer are negatively correlated among the subpixels of different colors.

17 Claims, 8 Drawing Sheets

(51) Int. Cl.
  *H01L 51/56* (2006.01)
  *H01L 51/52* (2006.01)
(52) U.S. Cl.
  CPC ...... *H01L 51/5088* (2013.01); *H01L 51/5265* (2013.01); *H01L 51/56* (2013.01); *H01L 2227/323* (2013.01); *H01L 2251/558* (2013.01)
(58) Field of Classification Search
  CPC ........... H01L 51/5088; H01L 2251/558; H01L 2227/323; H01L 27/3283; H01L 27/3295; H01L 27/3211–3218; G09G 2300/0443–0447; G09G 2300/0452; G09G 2340/0457
  See application file for complete search history.

(56) References Cited

U.S. PATENT DOCUMENTS

| 2015/0144919 A1* | 5/2015 | Matsumoto | H01L 27/322 257/40 |
| 2017/0329163 A1* | 11/2017 | Ye | G02F 1/1368 |
| 2018/0061896 A1 | 3/2018 | Cheng et al. | |
| 2019/0363276 A1* | 11/2019 | Li | H01L 51/5072 |
| 2020/0328368 A1* | 10/2020 | Chung | H01L 51/5215 |

FOREIGN PATENT DOCUMENTS

| CN | 104600097 A | 5/2015 |
| CN | 107204400 A | 9/2017 |
| CN | 107256879 A | 10/2017 |
| CN | 103779501 B | 5/2018 |
| CN | 108493228 A | 9/2018 |
| CN | 109037301 A | 12/2018 |

OTHER PUBLICATIONS

First Office Action in the Chinese Patent Application No. 201811488774. 8, dated Dec. 20, 2019; English translation attached.

Second Office Action in the Chinese Patent Application No. 201811488774.8, dated Jun. 1, 2020; English translation attached.

\* cited by examiner

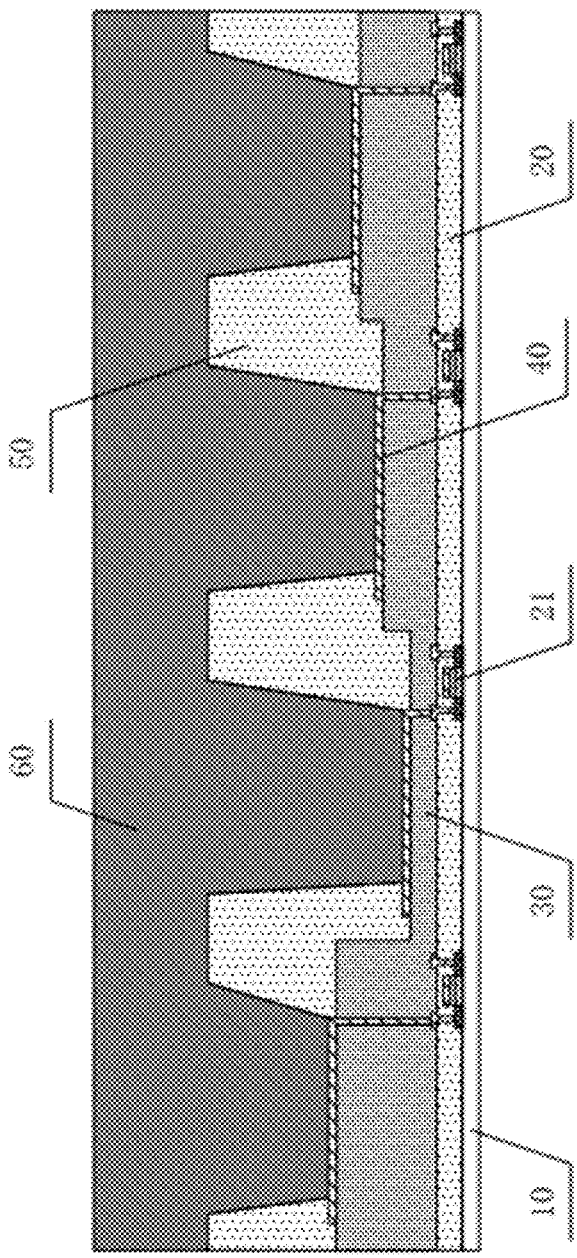
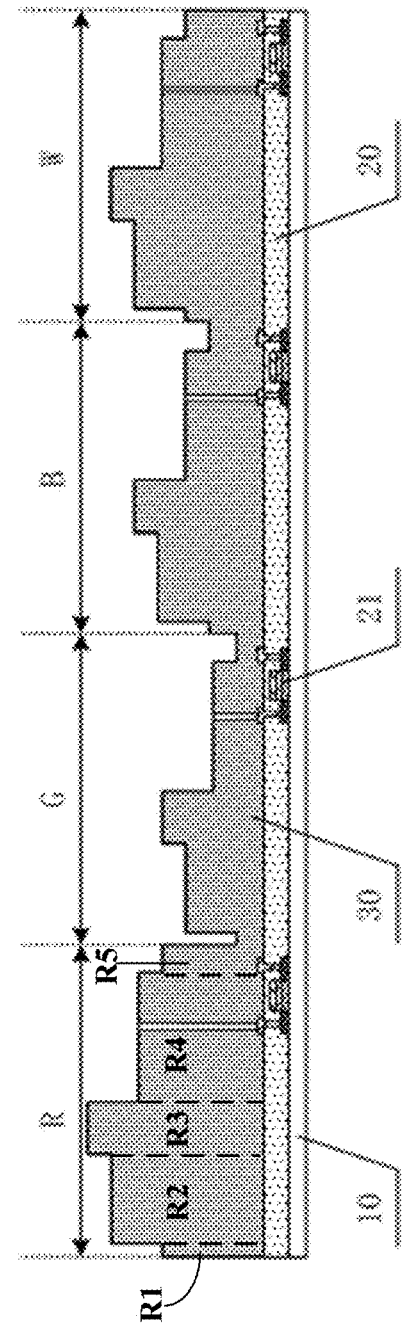
FIG. 13
FIG. 14A

DISPLAY SUBSTRATE, DISPLAY PANEL, DISPLAY APPARATUS, AND METHOD OF FABRICATING A DISPLAY SUBSTRATE THEREOF

CROSS-REFERENCE TO RELATED APPLICATION

This application is a national stage application under 35 U.S.C. § 371 of International Application No. PCT/CN2019/076327, filed Feb. 27, 2019, which claims priority to Chinese Patent Application No. 201811488774.8, filed Dec. 6, 2018, the contents of which are incorporated by reference in the entirety.

TECHNICAL FIELD

The present invention relates to display technology, more particularly, to a display substrate, a display panel, a display apparatus, and a method of fabricating a display substrate.

BACKGROUND

The organic light emitting diode (OLED) device is an active light emitting display device. The OLED has many advantages including self-illumination, wide viewing angle, high contrast, low power consumption, and fast reaction speed. At present, to fabricating OLED product having a small size, a vapor deposition using the Fine Metal Mask (FMM) is adopted to form an organic electroluminescent layer of the OLED produce. In order for a small-sized OLED product to have low power consumption, high color gamut, and more light output, the small-sized OLED product generally has a microcavity structure.

SUMMARY

In one aspect, the present invention provides a display substrate having an array of a plurality of subpixels, comprising a base substrate; a pixel driving layer comprising a plurality of thin film transistors on the base substrate; a tuning layer on a side of the pixel driving layer away from the base substrate, thicknesses of the tuning layer being different in subpixels of different colors; and a plurality of organic light emitting diodes on a side of the tuning layer away from the pixel driving layer; wherein a respective one of the plurality of organic light emitting diodes comprises a hole injection layer, thicknesses of the hole injection layer being different in subpixels of different colors; and the thicknesses of the tuning layer and the thicknesses of the hole injection layer are negatively correlated among the subpixels of different colors.

Optionally, the display substrate further comprises a pixel definition layer on a side of the tuning layer away from the base substrate, and defining a plurality of subpixel apertures; wherein a surface of the pixel definition layer away from the base substrate has a substantially same height relative to a main surface of the base substrate throughout the plurality of subpixels; heights of the pixel definition layer relative to a surface of the tuning layer away from the base substrate are different in the subpixels of different colors; and the thicknesses of the tuning layer and the heights of the pixel definition layer relative to the surface of the tuning layer are negatively correlated among the subpixels of different colors.

Optionally, the respective one of the plurality of organic light emitting diodes further comprises a first electrode between the tuning layer and the hole injection layer; the first electrode is electrically connected to a respective one of the plurality of thin film transistors through a via extending through the tuning layer.

Optionally, heights of the first electrode relative to the base substrate being different in the subpixels of different colors; and the heights of the first electrode relative to the base substrate and the thicknesses of the hole injection layer are negatively correlated among the subpixels of different colors.

Optionally, the respective one of the plurality of organic light emitting diodes further comprises a second electrode on a side of the hole injection layer away from the first electrode; a microcavity in the respective one of the plurality of organic light emitting diodes is formed using the first electrode and the second electrode as reflective mirrors; and lengths of the microcavity and the thicknesses of the tuning layer are negatively correlated among the subpixels of different colors.

Optionally, a surface of the tuning layer in a respective one of the plurality of subpixel apertures is substantially flat.

Optionally, a surface of the tuning layer in a respective one of the plurality of subpixel apertures is a stepped surface having one or a combination of one or more protrusions and one or more recesses.

Optionally, the subpixels of different colors comprise a red subpixel, a green subpixel, a blue subpixel, and a white subpixel; a thickness of the tuning layer in the red subpixel is greater than a thickness of the tuning layer in the white subpixel; a thickness of the tuning layer in the white subpixel is greater than a thickness of the tuning layer in the blue subpixel; a thickness of the tuning layer in the blue subpixel is greater than a thickness of the tuning layer in the green subpixel; a thickness of the hole injection layer in the red subpixel is less than a thickness of the hole injection layer in the white subpixel; a thickness of the hole injection layer in the white subpixel is less than a thickness of the hole injection layer in the blue subpixel; and a thickness of the hole injection layer in the blue subpixel is less than a thickness of the hole injection layer in the green subpixel.

In another aspect, the present invention provides a display panel comprising the display panel described herein or fabricated by a method described herein, and a counter substrate facing the display substrate.

In another aspect, the present invention provides a display apparatus comprising the display panel described herein or fabricated by a method described herein, and one or more integrated circuits connected to the display panel.

In another aspect, the present invention provides a method of fabricating a display substrate having an array of a plurality of subpixels, comprising forming a pixel driving layer comprising a plurality of thin film transistors on a base substrate; forming a tuning layer on a side of the pixel driving layer away from the base substrate, thicknesses of the tuning layer being formed differently in subpixels of different colors; and forming a plurality of organic light emitting diodes on a side of the tuning layer away from the pixel driving layer; wherein forming a respective one of the plurality of organic light emitting diodes comprises forming a hole injection layer, thicknesses of the hole injection layer being formed differently in subpixels of different colors; and the thicknesses of the tuning layer and the thicknesses of the hole injection layer are negatively correlated among the subpixels of different colors Optionally, the tuning layer having different thicknesses in the subpixels of different colors is formed in a same patterning process using a multi-tone mask plate.

Optionally, forming a tuning layer comprises coating a tuning material layer on side of the pixel driving layer away from the base substrate; exposing the tuning material layer using the multi-tone mask plate; developing the tuning material layer subsequent to exposing the tuning material layer, thereby forming the tuning layer having different thicknesses in the subpixels of different colors.

Optionally, the tuning layer is formed so that a surface of the tuning layer in a respective one of a plurality of subpixel apertures is substantially flat Optionally, the tuning layer is formed so that a surface of the tuning layer in a respective one of a plurality of subpixel apertures is a stepped surface having one or a combination of one or more protrusions and one or more recesses.

Optionally, the method of fabricating a display substrate further comprises forming a pixel definition layer on a side of the tuning layer away from the base substrate, to define a plurality of subpixel apertures; wherein a surface of the pixel definition layer away from the base substrate is formed to have a substantially same height relative to a main surface of the base substrate throughout the plurality of subpixels; heights of the pixel definition layer relative to a surface of the tuning layer away from the base substrate are formed differently in the subpixels of different colors; and the thicknesses of the tuning layer and the heights of the pixel definition layer relative to the surface of the tuning layer are negatively correlated among the subpixels of different colors.

Optionally, forming the hole injection layer comprises coating a hole injection material solution to fill the plurality of subpixel apertures; and drying the hole injection material solution, thereby forming the hole injection layer having different thicknesses in subpixels of different colors.

Optionally, forming the hole injection layer comprises vapor depositing a hole injection material layer to fill the plurality of subpixel apertures; and planarizing a surface of the hole injection material layer by polishing or thermal reflux, thereby forming the hole injection layer having different thicknesses in subpixels of different colors.

Optionally, forming the respective one of the plurality of organic light emitting diodes further comprises forming a first electrode, the first electrode formed between the tuning layer and the hole injection layer and electrically connected to a respective one of the plurality of thin film transistors through a via extending through the tuning layer; heights of the first electrode relative to the base substrate are formed differently in the subpixels of different colors; and the heights of the first electrode relative to the base substrate and the thicknesses of the hole injection layer are negatively correlated among the subpixels of different colors.

Optionally, forming the respective one of the plurality of organic light emitting diodes further comprises forming a second electrode on a side of the hole injection layer away from the first electrode, thereby forming a microcavity in the respective one of the plurality of organic light emitting diodes using the first electrode and the second electrode as reflective mirrors; and lengths of the microcavity and the thicknesses of the tuning layer are negatively correlated among the subpixels of different colors.

BRIEF DESCRIPTION OF THE FIGURES

The following drawings are merely examples for illustrative purposes according to various disclosed embodiments and are not intended to limit the scope of the present invention.

FIG. 13 is a schematic diagram illustrating a surface of the hole injection material layer is planarized by thermal reflux in some embodiments according to the present disclosure.

FIGS. 14A and 14B are schematic diagrams of a tuning layer having a stepped surface in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The materials used in the process of vapor deposition using the Fine Metal Mask is expensive. In addition, the method of using the Fine Metal Mask to produce small-sized OLED products cannot achieve stable mass production. In order to achieve stable mass production of large-sized OLED products, the inkjet printing is used to form an organic electroluminescent layer and to further form the microcavity structure. However, when the inject printing is used to produce small-sized OLED products, the inject printing is immature, and may lead to low production efficiency, high production cost, and low yield.

Accordingly, the present disclosure provides, inter alia a display substrate, a display panel, a display apparatus, and a method of fabricating a display substrate that substantially obviate one or more of the problems due to limitations and disadvantages of the related art. In one aspect, the present disclosure provides a display substrate having an array of a plurality of subpixels. In some embodiments, the display substrate having an array of a plurality of subpixels includes a base substrate; a pixel driving layer including a plurality of thin film transistors on the base substrate; a tuning layer on a side of the pixel driving layer away from the base substrate, thicknesses of the tuning layer being different in subpixels of different colors; and a plurality of organic light emitting diodes on a side of the tuning layer away from the pixel driving layer. Optionally, a respective one of the plurality of organic light emitting diodes includes a hole injection layer, thicknesses of the hole injection layer being different in subpixels of different colors. Optionally, the thicknesses of the tuning layer and the thicknesses of the hole injection layer are negatively correlated among the subpixels of different colors.

As used herein, the term "negative correlation" or "negatively correlated" as mentioned herein refers to a relationship between two variables in which one variable increases as the other variable decreases, e.g., values of the two variables generally change in opposite directions. Optionally, the negative correlation can be a perfect negative correlation, or other types of negative correlation. In one example, as the thickness of the tuning layer becomes thicker, the thickness of the hole injection layer becomes thinner. In another example, as the thickness of the tuning layer becomes thinner, the thickness of the hole injection layer becomes thicker.

Figure 1A:
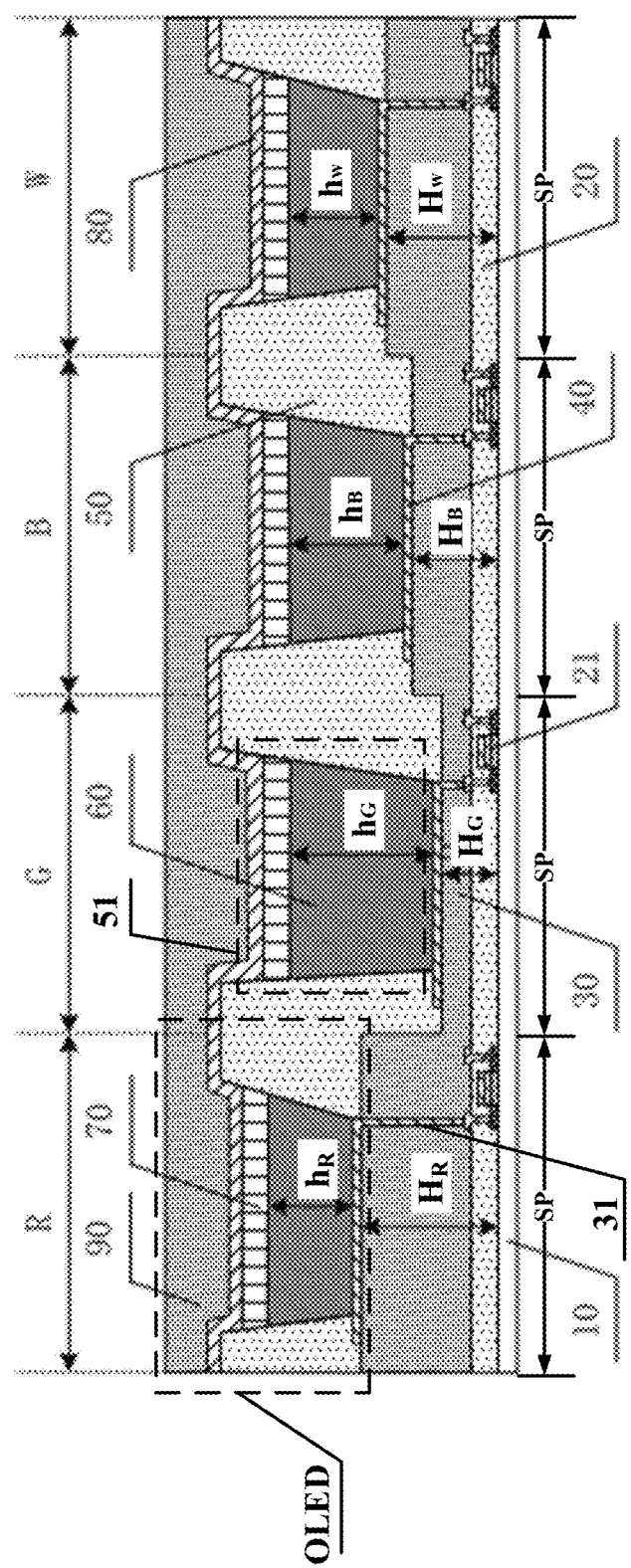
FIG. 1A is a schematic diagram of a structure of OLED display substrate in some embodiments according to the present disclosure.

FIG. 1A is a schematic diagram of a structure of OLED display substrate in some embodiments according to the present disclosure. The OLED as shown in FIG. 1A is a top-emitting OLED. Referring to FIG. 1A, in some embodiment, the display substrate having an array of a plurality of subpixels SP. Optionally, the plurality of subpixels SP includes subpixels of different colors. Optionally, the subpixels of different colors include a red subpixel R, a green subpixel G, a blue subpixel B, and a white subpixel W. Optionally, by adjusting a thickness of a tuning layer 30 of the display substrate, a microcavity structure is formed in each individual subpixel.

As used herein, the term "microcavity" refers to a resonant optical cavity in a solid-state light emitting device. For example, in the context of the present disclosure, a microcavity includes two reflective mirrors and a microcavity layer sandwiched there-between. Optionally, the microcavity has an optical distance substantially equal to a sum of optical path lengths of layers between the two reflective mirrors. As used herein, the term "optical path length" refers to a value obtained by multiplying a refractive index n of a medium through which the measurement light travels by a distance the measurement light travels through the medium having the refractive index n, i.e., the optical path length is equal to a distance the measurement light would travel through a vacuum during the time it takes for the measurement light to travel through the medium having the refractive index n.

Figure 1B:
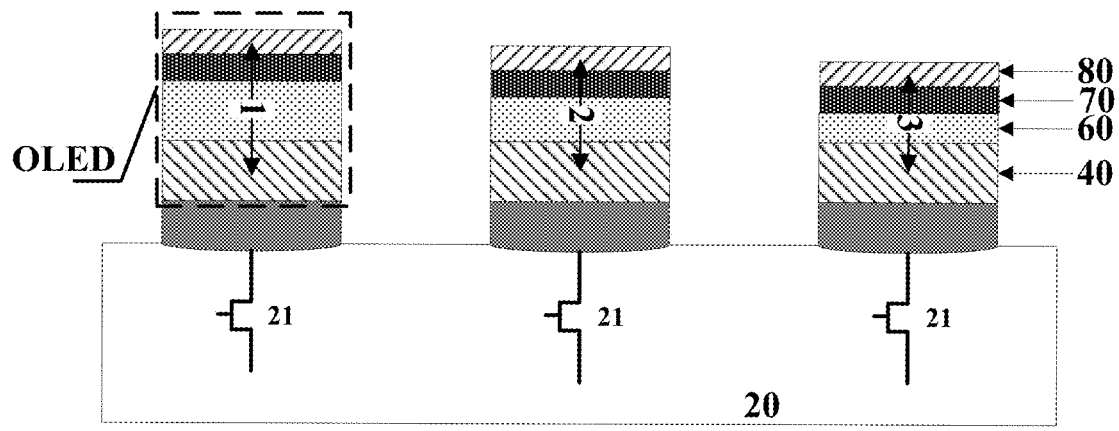
FIG. 1B is a schematic diagram of a structure of microcavities in some embodiments according to the present disclosure.

FIG. 1B is a schematic diagram of a structure of microcavities in some embodiments according to the present disclosure. Referring to FIG. 1B, the display substrate having a microcavity structure in some embodiments includes a pixel driving layer 20 having a plurality of thin film transistors 21, and a plurality of organic light emitting diodes OLED. A respective one of the plurality of organic light emitting diode OLED includes a first electrode 40, organic layers (e.g. including a hole injection layer 60 and a light emission functional layer 70) on a side of the first electrode 40 away from the pixel driving layer 20, and a second electrode 80 on a side of the organic layers away from the pixel driving layer 20. In some embodiments, a respective one of the plurality of microcavities is in one of the plurality of organic light emitting diodes OLED. Optionally, the plurality of microcavities include a first microcavity 1 having a first optical path length, and a second microcavity 2 having a second optical path length different from the first optical path length. Optionally, the first microcavity 1 is configured to allow a light of a first color to transmit there-through. Optionally, the second microcavity 2 is configured to allow a light of a second color to transmit there-through, the first color and the second color being two different colors. Optionally, the plurality microcavities include a first microcavity 1 having a first optical path length, a second microcavity 2 having a second optical path length, and a third microcavity 3 having a third optical path length; the first optical path length, the second optical path length, and the third optical path length being different from each other. Optionally, the first microcavity 1 is configured to allow light of a first color to transmit there-through, the second microcavity 2 is configured to allow light of a second color to transmit there-through, the third microcavity 3 is configured to allow light of a third color to transmit there-through. The first color, the second color, and the third color are three different colors. Optionally, the first color, the second color, and the third color are red, green, and blue.

Referring to FIG. 1, in some embodiments, the display substrate includes a base substrate 10, a pixel driving layer 20 on a side of the base substrate 10. Optionally, the pixel driving layer 20 includes a plurality of thin film transistors 21 on the base substrate 10.

In some embodiments, the display substrate includes a tuning layer 30 on a side of the pixel driving layer 20 away from the base substrate 10. Optionally, thicknesses of the tuning layer 30 are different in subpixels of different colors. Optionally, a thickness H of the tuning layer 30 is a normal distance between a surface of the tuning layer 30 away from the base substrate and a surface of the base substrate 10 closer to the tuning layer 30. For example, a thickness H of the tuning layer 30 in the red subpixel R is $H_R$, a thickness H of the tuning layer 30 in the green subpixel G is $H_G$, a thickness H of the tuning layer 30 in the blue subpixel B is $H_B$, and a thickness H of the tuning layer 30 in the white subpixel W is $H_W$.

In some embodiments, the display substrate includes a plurality of organic light emitting diode OLED on a side of the tuning layer 30 away from the pixel driving layer 20. A respective one of the plurality of organic light emitting diodes OLED includes a first electrode 40, a pixel definition layer 50, a hole injection layer 60, a light emission functional layer 70, a second electrode 80 and an encapsulating layer 90.

In some embodiments, the first electrode 40 is on a side of the tuning layer 30 away from the pixel driving layer 20. Optionally, the first electrode 40 is between the tuning layer 30 and the hole injection layer 60. Optionally, the first electrode 40 is electrically connected to a respective one of the plurality of thin film transistors 21 through a via 31 extending through the tuning layer 30. For example, the first electrode 40 is electrically connected to a drain electrode of the respective one of the plurality of thin film transistors 21 through the via 31 extending through the tuning layer 30.

In some embodiments, the display substrate includes the pixel definition layer 50 on a side of the tuning layer 30 away from the base substrate 10. The pixel definition layer 50 defines a plurality of subpixel apertures 51. Optionally, the first electrode 40 in a respective one of the plurality of subpixel apertures 51 is exposed or partially exposed.

In some embodiments, a respective one of the plurality of organic light emitting diodes OLED includes a hole injection layer 60. Optionally, a hole injection layer 60 is disposed in a respective one of the plurality of subpixel apertures 51 defined by the pixel definition layer 50.

In some embodiments, thicknesses of the hole injection layer 60 is different in subpixels of different colors. Optionally, the thicknesses of the hole injection layer 60 is determined by the thicknesses of the tuning layer 30. Optionally, the thicknesses of the tuning layer 30 and the thicknesses of the hole injection layer 60 are negatively correlated among the subpixels of different colors. For example, a thickness h of the hole injection layer 60 in the red subpixel R is $h_R$, a thickness h of the hole injection layer 60 in the green subpixel G is $h_G$, a thickness h of the hole injection layer 60 in the blue subpixel B is $h_B$, and a thickness h of the hole injection layer 60 in the white subpixel W is $h_W$.

In some embodiments, the light emission functional layer 70 is on a side of the hole injection layer 60 away from the base substrate 10.

In some embodiments, the second electrode 80 is on a side of the hole injection layer 60 away from the first electrode 40. Optionally, the second electrode 80 is on a side of the light emission functional layer 70 away from the first electrode 40.

In some embodiments, the encapsulating layer 90 is on a side of the second electrode 80. Optionally, an orthographic projection of the encapsulating layer 90 on the base substrate 10 covers the base substrate 10.

Figure 2:
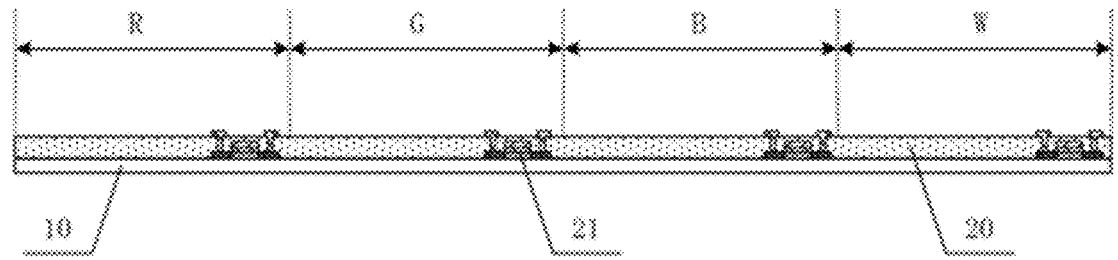
FIG. 2 is a schematic diagram illustrating that a pixel diving layer is formed in some embodiments according to the present disclosure.

FIG. 2 is a schematic diagram illustrating that a pixel diving layer is formed in some embodiments according to the present disclosure. Referring to FIG. 2, in some embodiments, a pixel driving layer 20 is formed on a base substrate 10. The pixel driving layer 20 includes a plurality of gate lines and a plurality of data lines. Optionally, the plurality of gate lines and the plurality of data lines are perpendicular to each other to define a plurality of pixels. A respective one of the plurality of pixels includes at least two subpixels of the plurality of subpixels SP. A respective one of the subpixels includes one of the plurality of thin film transistors 21.

In one example, a respective one of the pixels includes four subpixels. The four subpixels are a red subpixel R, a green subpixel G, a blue subpixel B, and a white subpixel W. In another example, the respective one of the pixels includes three subpixels. The three subpixels are a red subpixel R, a green subpixel G, and a blue subpixel B. In another example, the respective one of the pixels includes two subpixels. The two subpixels can be selected from a group consisting of a red subpixel R, a green subpixel G, and a blue subpixel B.

Optionally, the plurality of thin film transistors 21 have a bottom gate structure. Optionally, the plurality of thin film transistors 21 have a top gate structure.

Optionally, the plurality of thin film transistors 21 can be a plurality of amorphous silicon (a-Si) thin film transistors. Optionally, the plurality of thin film transistors 21 can be a plurality of low temperature polysilicon (LTPS) thin film transistors. Optionally, the plurality of thin film transistors 21 can be a plurality of oxide thin film transistors.

Various appropriate materials may be used for making the base substrate 10. Examples of materials suitable for making the base substrate 10 include, but are not limited to, high light transmissive materials, and polymer films. Optionally, the high light transmissive materials include glass, quartz, polyolefin resin, polyethylene naphthalate resin, polyimide resin, polyphthalic plastic, and a phenol resin. Optionally, the surface of the polymer film is treated.

Figure 3:
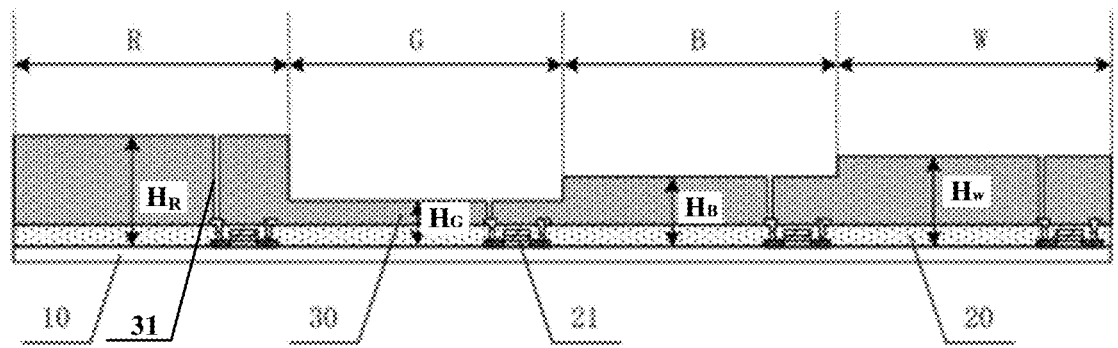
FIG. 3 is a schematic diagram illustrating that a tuning layer is formed in some embodiments according to the present disclosure.

FIG. 3 is a schematic diagram illustrating that a tuning layer is formed in some embodiments according to the present disclosure. Referring to FIG. 3, the tuning layer 30 is formed on a side of the pixel driving layer 20 away from the base substrate 10. Optionally, the thicknesses of the tuning layer 30 in subpixels of different colors are different from each other.

In some embodiments, a thickness $H_R$ of the tuning layer 30 in the red subpixel R is greater than a thickness $H_W$ of the tuning layer 30 in the white subpixel W; a thickness $H_W$ of the tuning layer 30 in the white subpixel W is greater than a thickness $H_B$ of the tuning layer 30 in the blue subpixel B; a thickness $H_B$ of the tuning layer 30 in the blue subpixel B is greater than a thickness $H_G$ of the tuning layer in the green subpixel G. E.g. $H_R > H_W > H_B > H_G$.

Various materials may be used for making the tuning layer 30. Examples of materials suitable for making the tuning layer 30 include, but are not limited to, organic materials, and inorganic materials. Optionally, the tuning layer 30 is made of organic materials. Photolithography process may be adopted to pattern the tuning layer 30. Optionally, the tuning layer 30 is made of inorganic materials. Etching process may be adopted to pattern the tuning layer 30.

As used herein, the term "patterning" or "pattern" refers to a process includes depositing a material layer, coating photoresist, mask exposing, developing, etching, stripping photoresist. Optionally, depositing a material layer uses methods including sputtering, chemical vapor deposition.

As used herein, the term "lithography" refers to a process includes coating a material layer, mask exposing, developing.

In some embodiments, an insulating layer may be formed between the tuning layer 30 and the pixel driving layer 20, to cover the gate lines, the source electrodes, and the drain electrodes of the plurality of thin film transistors 21 in the pixel driving layer 20.

In some embodiments, a surface of the tuning layer 30 in a respective one of the plurality of subpixel apertures 51 is substantially flat.

In some embodiments, a surface of the tuning layer 30 in a respective one of the plurality of subpixel apertures is a stepped surface having one or a combination of one or more protrusions and one or more recesses.

Figure 4:
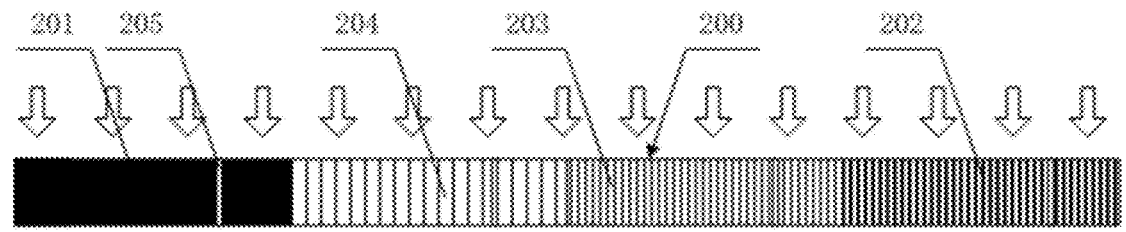
FIG. 4 is a schematic diagram illustrating that a multi-tone mask plate is formed in some embodiments according to the present disclosure.

FIG. 4 is a schematic diagram illustrating that a multi-tone mask plate is formed in some embodiments according to the present disclosure. Referring to FIG. 4, in some embodiments, a multi-tone mask plate 200 is used to form the tuning layer 30 having different thicknesses in subpixels of different colors. Optionally, the multi-tone mask plate 200 includes five light transmission areas. The five transmission areas include a first light transmission area 201, a second light transmission area 202, a third light transmittance area 203, a fourth light transmittance area 204, and a fully transparent area 205.

In some embodiments, a first light transmittance T1 of the first light transmission area 201 is smaller than a second light transmittance T2 of the second light transmission area 202. The second light transmittance T2 of the second light transmission area 202 is smaller than a third light transmittance T3 of the third light transmittance area 203. The third light transmittance T3 of the third light transmittance area 203 is smaller than a fourth light transmittance T4 of the fourth light transmittance area 204. The fourth light transmittance T4 of the fourth light transmittance area 204 is smaller than a fifth light transmittance T5 of the fully transparent area 205. E.g. T1<T2<T3<T4<T5.

Optionally, the first light transmittance T1 of the first light transmission area 201 can be 0%. For example, the first light transmission area 201 is an opaque area. No exposure is on an area of the tuning layer 30 corresponding to the first light transmission area 201. Optionally, the fifth light transmittance T5 of the fully transparent area 205 is 100%. For example, the fully transparent area 205 allows all the light to pass through, and an area of the tuning layer 30 corresponding to the fully transparent area 205 is completely exposed to light.

During the exposing process, the five light transmission areas of the multi-tone mask plate 200 allow the tuning layer 30 to have different level exposures, and to form different level exposure areas, including first level exposure area, second level exposure area, third level exposure area, fourth level exposure area, and fifth level exposure area. The exposure level of different exposure areas increases from a first level of the first level exposure area to a fifth level of the fifth level exposure area. For example, the fifth level exposure area corresponding to the fully transparent area 205 is completely exposed to light.

Referring to both FIG. 3 and FIG. 4, subsequent to developing the tuning material layer, a via 31 is formed on the fifth level exposure area corresponding to the fully transparent area 205 of the multi-tone mask plate 200. A tuning layer 32 having the thickness $H_R$ is formed on the first level exposure area corresponding to the first light transmission area 201 of the multi-tone mask plate 200. A tuning layer 32 having a thickness $H_w$ is formed on the second level exposure area corresponding to the second light transmission area 202 of the multi-tone mask plate 200. A tuning layer 32 having a thickness $H_B$ is formed on the third level exposure area corresponding to the third light transmission area 203 of the multi-tone mask plate 200. A tuning layer 32 having a thickness $H_G$ is formed on the fourth level exposure area corresponding to the fourth light transmission area 204 of the multi-tone mask plate 200.

Figure 14B:
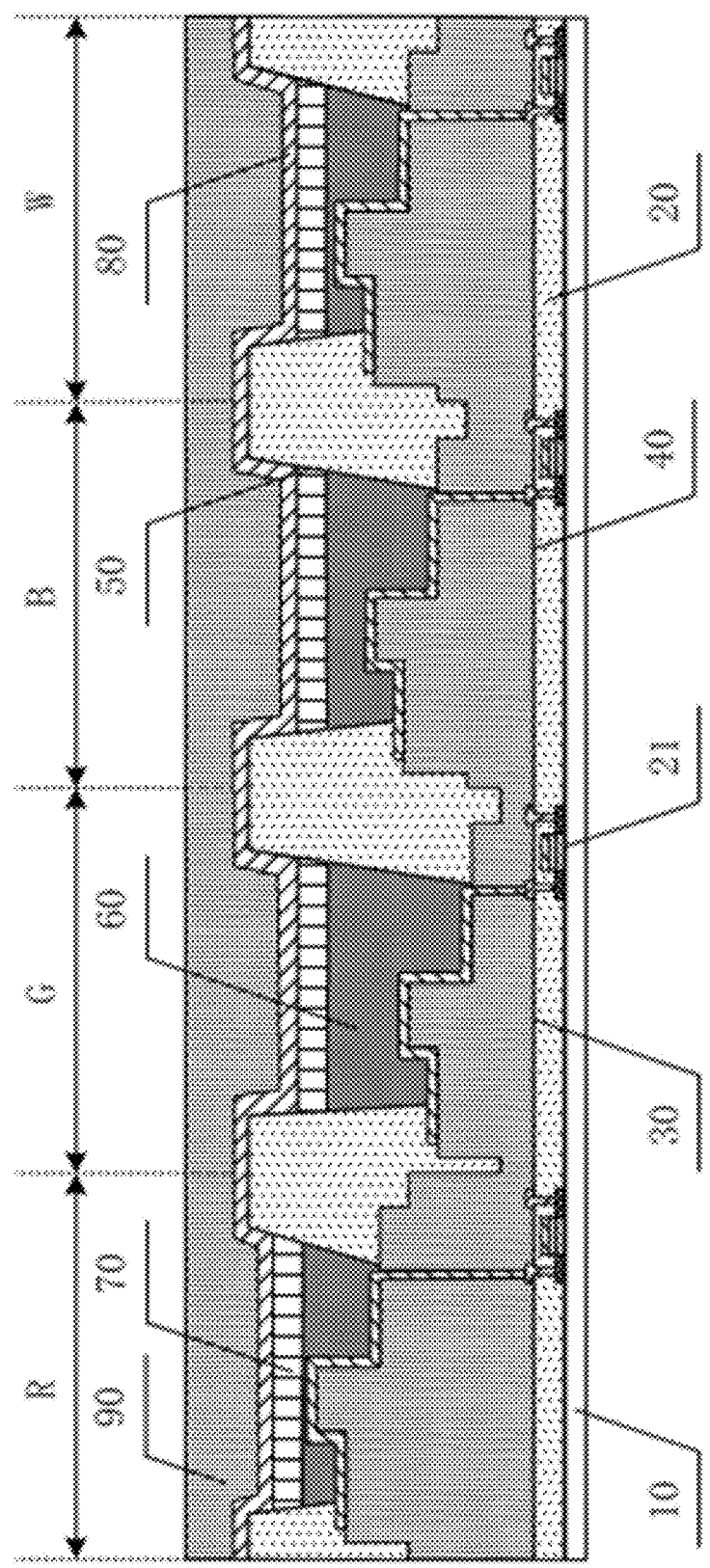

FIGS. 14A and 14B are schematic diagrams of a tuning layer having a stepped surface in some embodiments according to the present disclosure. Referring to both FIG. 14A and FIG. 14B, in some embodiments, by adjusting the light transmission areas of the multi-tone mask plate, a stepped surface of the tuning layer 30 in a respective one of the plurality of subpixel apertures can be formed using lithography process. Optionally, the stepped surface of the tuning layer 30 in a respective one of the plurality of subpixel apertures has one or a combination of one or more protrusions and one or more recesses.

Optionally, the thicknesses of the tuning layer 30 in subpixels of different colors is measure by equivalent thicknesses. For example, an equivalent thickness of the tuning layer 30 in a respective one of subpixels of different colors is an arithmetic mean or a geometric mean of a sum of thicknesses of all parts of the tuning layer 30 having the protrusions or recesses in the respective one of subpixels of different colors. For example, referring to FIG. 14A, the red subpixel R has five parts defined by the protrusions and the recesses on the tuning layer 30 in the red subpixel R. The five parts of the red subpixels R include a first part R1, a second part R2, a third part R3, a fourth part R4, and a fifth part R5. An equivalent thickness of the red subpixel R is an arithmetic mean or a geometric mean of a sum of a thickness of the first part R1, a thickness of the second part R2, a thickness of the third part R3, a thickness of the fourth part R4, and a thickness of the fifth part R5.

Figure 5:
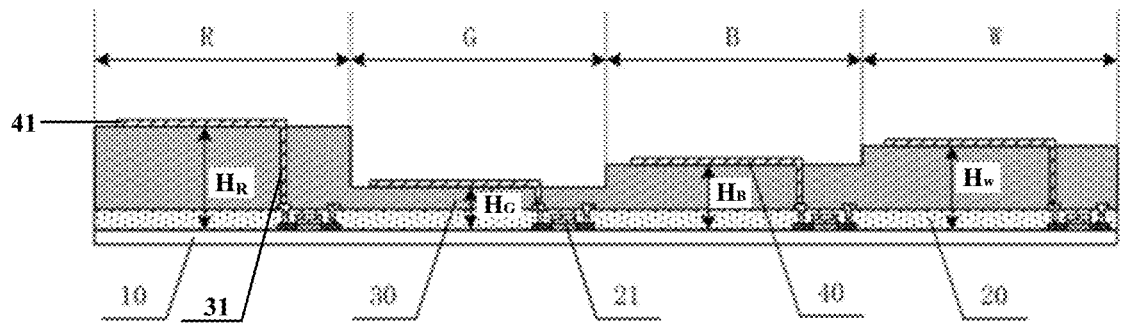
FIG. 5 is a schematic diagram illustrating that a first electrode is formed in some embodiments according to the present disclosure.

FIG. 5 is a schematic diagram illustrating that a first electrode is formed in some embodiments according to the present disclosure. Referring to FIG. 5, in some embodiments, a first electrode 40 of the respective one of the plurality of subpixels SP is formed on a side of the tuning layer 30 away from the base substrate 10. The first electrode 40 is electrically connected to a respective one of the plurality of thin film transistors 21 through a via 31 extending through the tuning layer 30. Optionally, heights of the first electrode 40 relative to the base substrate 10 are different in in the subpixels of different colors.

In some embodiments, the OLED display substrate has a top emission structure. The first electrode 40 is a reflective electrode. Various appropriate materials may be used for making the first electrode 40 as a reflective electrode. Examples of materials suitable for making the first electrode 40 include, but are not limited to, metals with high reflectivity, alloys with high reflectivity, and a multi-layer structure having metals with high reflectivity. Optionally, the metals with high reflectivity include silver (Ag), gold (Au), palladium (Pd), and platinum (Pt). Optionally, the alloys with high reflectivity include a combination of two or more elements selected from a group consisting of silver (Ag), gold (Au), palladium (Pd), and platinum (Pt). Optionally, the first electrode 40 can use a multi-layer structure having an indium tin oxide (ITO) layer and a metal layer with high reflectivity. The multi-layer structure has good conductivity, high reflectivity, and good morphological stability.

In some embodiments, the first electrode 40 is formed on a side of the stepped surface of the tuning layer 30 in a respective one of the plurality of subpixel apertures, the first electrode 40 also has a stepped surface. Referring to FIG. 1A, the microcavity formed using the first electrode 40 and the second electrode 80 as reflective mirrors can effectively eliminate the color shift due to the stepped surface of the first electrode 40. The quality of image display can be improved due to the elimination of the color shift.

The microcavity formed using the first electrode 40 and the second electrode 80 as reflective mirrors leads to a strong multi-beam interference which may select, narrow, and strengthen the light source. So, the microcavity can increase the chromaticity, enhance the emission intensity of light with a specific wavelength, change the luminescent color. However, the microcavity may change the viewing angle characteristic of the OLED display panel, for example, with the increase of the viewing angle, the luminance peak shifts, the display panel may have display brightness differences and chromaticity drift, resulting in color shift. By forming a tuning layer 30 having a stepped surface including one or a combination of one or more protrusions and one or more recesses, the first electrode 40 on the stepped surface of the tuning layer 30 also has a stepped surface. When a light emitted from the light emission functional layer 70 towards the first electrode 40, the stepped surface of the first electrode 40 may reflect the light. The light reflected by the first electrode 40 becomes scattering light, which may effectively reduce the display brightness difference and chromatic shift in a large viewing angle, and effectively obviate the color shift issue.

Figure 6:
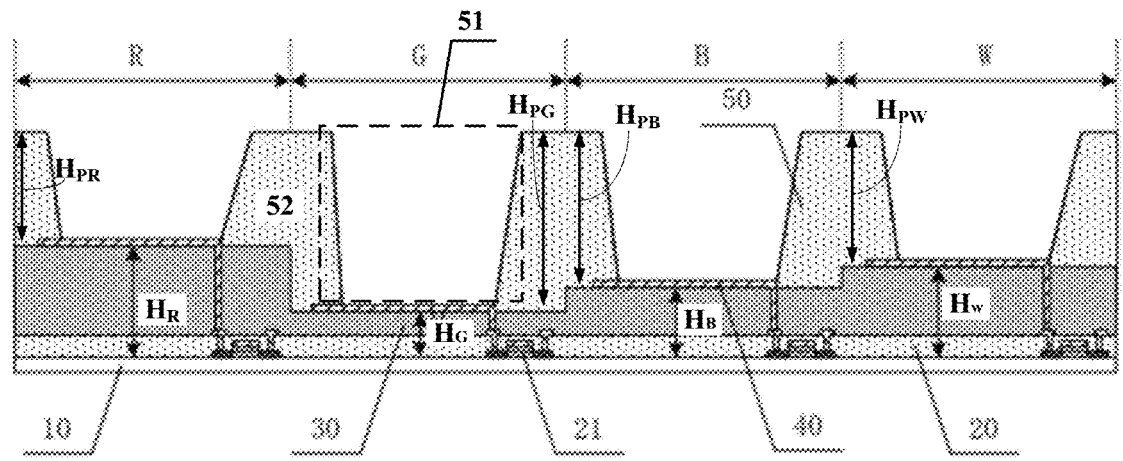
FIG. 6 is a schematic diagram illustrating that a pixel definition layer is formed in some embodiments according to the present disclosure.

FIG. 6 is a schematic diagram illustrating that a pixel definition layer is formed in some embodiments according to the present disclosure. Referring to FIG. 6, in some embodiments, a pixel definition layer 50 is formed on a side of the tuning layer 30 away from the base substrate 10 to define a plurality of subpixel apertures 51. Optionally, the first electrode 40 is formed between the pixel definition layer 50 and the tuning layer 30. Optionally, a respective one of the plurality of subpixel apertures 51 exposes the first electrode 40. Optionally, a respective one of the plurality of subpixel apertures exposes partial of the first electrode 40.

Various appropriate materials may be used for making the pixel definition layer 50. Examples of materials suitable for making the pixel definition layer 50 include, but are not limited to, polyimide, acrylic or polyethylene terephthalate.

In some embodiments, a surface of the pixel definition layer 50 away from the base substrate 10 has a substantially same height relative to a main surface of the base substrate 10 throughout the plurality of subpixels SP.

As used herein, the term "substantially same" refers to a difference between two values not exceeding 10% of a base value (e.g., one of the two values as the base value), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%. For example, a surface of the pixel definition layer away from the base substrate has a substantially same height relative to a main surface of the base substrate throughout the plurality of subpixels, which means the difference between a first height of a first portion of the surface of the pixel definition layer away from the base substrate to a main surface of the base substrate and a second height of a second portion of the surface of the pixel definition layer away from the base substrate to a main surface of the base substrate does not exceeds 10% of the first height, e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the first height.

In some embodiments, heights $H_P$ of the pixel definition layer 50 relative to a surface of the tuning layer 30 away from the base substrate 10 are different in the subpixels of different colors. For example, a height $H_{PR}$ of the pixel definition layer 50 relative to a surface of the tuning layer 30 away from the base substrate 10 in the red subpixel R is less than a height $H_{PW}$ of the pixel definition layer 50 relative to a surface of the tuning layer 30 away from the base substrate 10 in the white subpixel W. The height $H_{PW}$ of the pixel definition layer 50 relative to a surface of the tuning layer 30 away from the base substrate 10 in the white subpixel W is less than a height $H_{PB}$ of the pixel definition layer 50 relative to a surface of the tuning layer 30 away from the base substrate 10 in the blue subpixel B. The height $H_{PB}$ of the pixel definition layer 50 relative to a surface of the tuning layer 30 away from the base substrate 10 in the blue subpixel R is less than a height $H_{PG}$ of the pixel definition layer 50 relative to a surface of the tuning layer 30 away from the base substrate 10 in the green subpixel G. E.g. $H_{PR}<H_{PW}<H_{PB}<H_{PG}$.

In some embodiments, the thicknesses H of the tuning layer 30 and the heights $H_P$ of the pixel definition layer 50 relative to the surface of the tuning layer 30 are negatively correlated among the subpixels of different colors.

Figure 7:
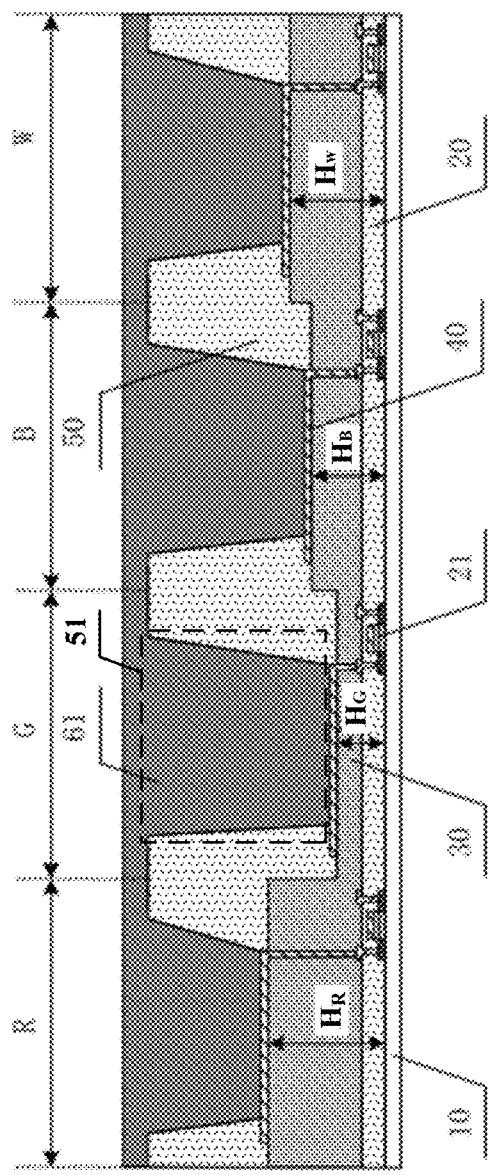
FIG. 7 is a schematic diagram illustrating that a hole injection material solution is filled in some embodiments according to the present disclosure.

FIG. 7 is a schematic diagram illustrating that a hole injection material solution is filled in some embodiments according to the present disclosure. Referring to FIG. 7, a hole injection material solution 61 is formed in the plurality of subpixel apertures 51. Optionally, the plurality of subpixel apertures 51 are fully filled with the hole injection materials solution 61. In one example, a height of the hole injection material solution 61 relative to a surface of the tuning layer 30 away from the base substrate 10 is greater than the heights of the pixel definition layer 50 relative to the surface of the tuning layer 30 away from the base substrate 10. In another example, an orthographic projection of the hole injection material solution 61 on the base substrates covers the tuning layer 30.

Figure 8:
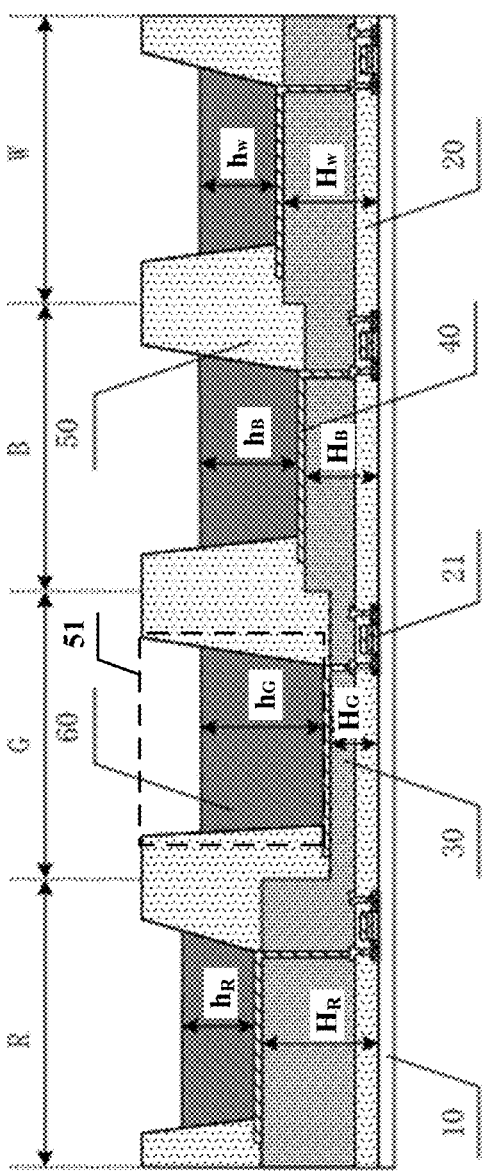
FIG. 8 is a schematic diagram illustrating that a hole injection layer is formed in some embodiments according to the present disclosure.

FIG. 8 is a schematic diagram illustrating that a hole injection layer is formed in some embodiments according to the present disclosure. Referring to FIG. 8, a hole injection layer 60 is formed by drying the hole injection material solution 61 as shown in FIG. 7. Optionally, the hole injection layer 60 in a respective one of the plurality of subpixel apertures 51 is in direct contact with a first electrode 40 in one of the plurality of subpixels SP.

Optionally, the thicknesses h of the hole injection layer 60 are different in subpixels of different colors. For example, a thickness $h_R$ of the hole injection layer 60 in the red subpixel R is less than a thickness $h_W$ of the hole injection layer 60 in the white subpixel W; the thickness $h_W$ of the hole injection layer 60 in the white subpixel W is less than a thickness $h_B$ of the hole injection layer 60 in the blue subpixel B; and the thickness $h_B$ of the hole injection layer 60 in the blue subpixel B is less than a thickness $h_G$ of the hole injection layer 60 in the green subpixel G. E.g. $h_R<h_W<h_B<h_G$.

Optionally, the thicknesses H of the tuning layer 30 and the thicknesses h of the hole injection layer 60 are negatively correlated among the subpixels of different colors. Optionally, the heights of the first electrode 40 relative to the base substrate 10 and the thicknesses h of the hole injection layer 60 are negatively correlated among the subpixels of different colors.

In some embodiments, a respective one of the plurality of microcavities are formed in one of the plurality of subpixels SP. Optionally, the plurality of microcavities having different optical path lengths allow light with different wavelengths to transmit through. By adjusting the thicknesses of the hole injection layer 60, the different optical path lengths can be obtained. Optionally, subpixels of different colors may have different optical path lengths corresponding to different thicknesses of the hole injection layer 60. Based on the different optional path lengths needed, the different thicknesses of the hole injection layer 60 in the subpixels of different colors can be calculated.

For example, the thicknesses of the hole injection layer 60 and the thicknesses of the tuning layer 30 are negatively correlated among the subpixels of different colors. The thicknesses of the tuning layer 30 relates to the light transmittance T of the multi-tone mask plate 200 as shown in FIG. 4. By designing different light transmittances T of the multi-tone mask plate 200, the hole injection layer 60 with different thicknesses can be formed. The thicknesses of the hole injection layer 60 can be accurately controlled using the method of forming a hole injection layer 60 disclosed in present disclosure. Also, the method of forming a hole injection layer 60 disclosed in present disclosure is simple, and it can be easily performed using the existing mature processes.

Various methods may be used for forming the hole injection layer 60. Examples of methods suitable for forming the hole injection layer 60 includes a combination of coating a hole injection material solution and drying the hole injection material solution 61 to form the hole injection layer; and a combination of vapor depositing a hole injection material layer and planarizing a surface of the hole injection material layer to form the hole injection layer. Optionally, planarizing the surface of the hole injection material layer includes polishing the surface of the hole injection material layer, and applying thermal reflux on the surface of the hole injection material layer.

The surface of the pixel definition layer 50 formed using coating process has a flat surface, so the surface of the pixel definition layer 50 away from the base substrate 10 has a substantially same height relative to a main surface of the base substrate 10 throughout the plurality of subpixels SP. A first electrode 40 in a respective one of the plurality subpixels is formed on a side of the tuning layer 30 away from the base substrate 10. Because the thicknesses H of the tuning layer 30 are different in subpixels of different colors. In subpixels of different colors, a height $H_P$ of the pixel definition layer 50 relative to a first electrode 40 in a respective one of subpixels of different colors is different from a height of the pixel definition layer 50 relative to a first electrode 40 in one subpixel having color different from the respective one of subpixels of different colors. The amounts of hole injection material solution 61 filled in different ones of the subpixels of different colors are different.

The hole injection material solution 61 in the plurality of subpixels SP has the same concentration. Subsequent to a drying process, the solvent of the hole injection material solution 61 evaporates, a respective one of the plurality of subpixels SP having a greater amount of hole injection material solution 61 has a thicker hole injection layer 60; a respective one of the plurality of subpixels SP having a smaller amount of hole injection material solution 61 has a thinner hole injection layer 60.

In some embodiments, the thickness $H_R$ of the tuning layer 30 in the red subpixel R is greater than the thickness $H_W$ of the tuning layer in the white subpixel W. The height $H_{PR}$ of the pixel definition layer 50 relative to a surface of the tuning layer 30 away from the base substrate 10 in the red subpixel R is less than the height $H_{PW}$ of the pixel definition layer 50 relative to a surface of the tuning layer 30 away from the base substrate 10 in the white subpixel W. An amount of hole injection material solution 61 in the red subpixel R is less than an amount of hole injection material solution 61 in the white subpixel W. So, the thickness $h_R$ of the hole injection layer 60 in the red subpixel R is less than the thickness $h_W$ of the hole injection layer 60 in the white subpixel W.

The thickness $H_W$ of the tuning layer 30 in the white subpixel W is greater than the thickness $H_B$ of the tuning layer 30 in the blue subpixel B. The height $H_{PW}$ of the pixel definition layer 50 relative to a surface of the tuning layer 30 away from the base substrate 10 in the white subpixel W is less than the height $H_{PB}$ of the pixel definition layer 50 relative to the surface of the tuning layer 30 away from the base substrate 10 in the blue subpixel B. An amount of hole injection material solution 61 in the white subpixel W is less than an amount of hole injection material solution 61 in the blue subpixel B. So, the thickness $h_W$ of the hole injection layer 60 in the white subpixel W is less than the thickness $h_B$ of the hole injection layer 60 in the blue subpixel B.

The thickness $H_B$ of the tuning layer 30 in the blue subpixel B is greater than the thickness $H_G$ of the tuning layer in the green subpixel G. The height $H_{PB}$ of the pixel definition layer 50 relative to a surface of the tuning layer 30 away from the base substrate 10 in the blue subpixel R is smaller than a height $H_{PG}$ of the pixel definition layer 50 relative to a surface of the tuning layer 30 away from the base substrate 10 in the green subpixel G. The thickness $h_B$ of the hole injection layer 60 in the blue subpixel B is less than the thickness $h_G$ of the hole injection layer 60 in the green subpixel G. An amount of hole injection material solution 61 in the blue subpixel B is less than an amount of hole injection material solution 61 in the green subpixel G. So, the thickness $h_B$ of the hole injection layer 60 in the blue subpixel B is less than a thickness $h_G$ of the hole injection layer 60 in the green subpixel G.

In some embodiments, the thicknesses h of the hole injection layer 60 and the heights of the pixel definition layer 50 relative to a surface of the tuning layer 30 away from the base substrate 10 are positively correlated among the subpixels of different. As used herein, the term "positive correlation" or "positively correlated" as mentioned herein refers to a relationship between two variables in which one variable increases as the other variable increases, e.g., values of the two variables generally change in a same directions. Optionally, the positive correlation can be a perfect negative correlation, or other types of positive correlation. In one example, the heights of the pixel definition layer 50 increases as the thickness of the hole injection layer 60 increases. In another example, if $H_{PR}<H_{PW}<H_{PB}<H_{PG}$, $h_R<h_W<h_B<h_G$.

In some embodiments, the thicknesses of the hole injection layer 60 and the thicknesses of the tuning layer 30 are negatively correlated among the subpixels of different. For example, as the thicknesses of the tuning layer 30 decreases, the thicknesses of the hole injection layer 60 increases, e.g. if $H_R>H_W>H_B>H_G$, $h_R<h_W<h_B<h_G$.

Figure 9:
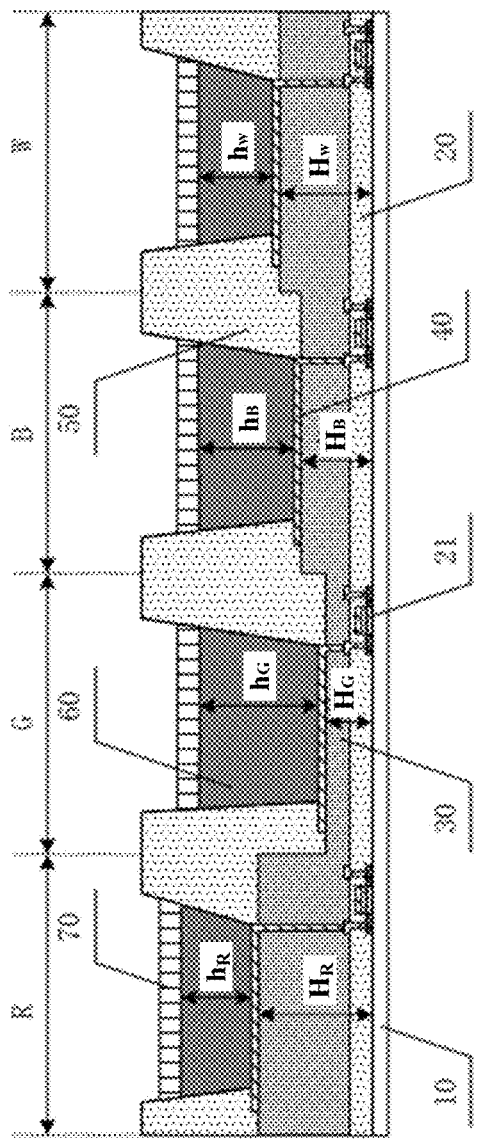
FIG. 9 is a schematic diagram illustrating that a light emission functional layer is formed in some embodiments according to the present disclosure.

FIG. 9 is a schematic diagram illustrating that a light emission functional layer is formed in some embodiments according to the present disclosure. Referring to FIG. 9, in some embodiments, a light emission functional layer 70 is formed on a side of the hole injection layer 60 away from the base substrate 10.

Optionally, the light emission functional layer 70 includes a light emission layer (EML). Optionally, the light emission functional layer 70 includes an electron transport layer (ETL), and a hold transport layer (HTL). Optionally, the light emission functional layer 70 includes an electron injection layer (EIL) between the electron transport layer (ETL) and a second electrode to improve the efficiency of injecting electrons and holes into the light emission layer. For example, the hold transport layer (HTL), the light emission layer (EML), the electron transport layer (ETL), and the electron injection layer (EIL) are sequentially formed on a side of the hole injection layer 60 away from the base substrate 10.

Figure 10:
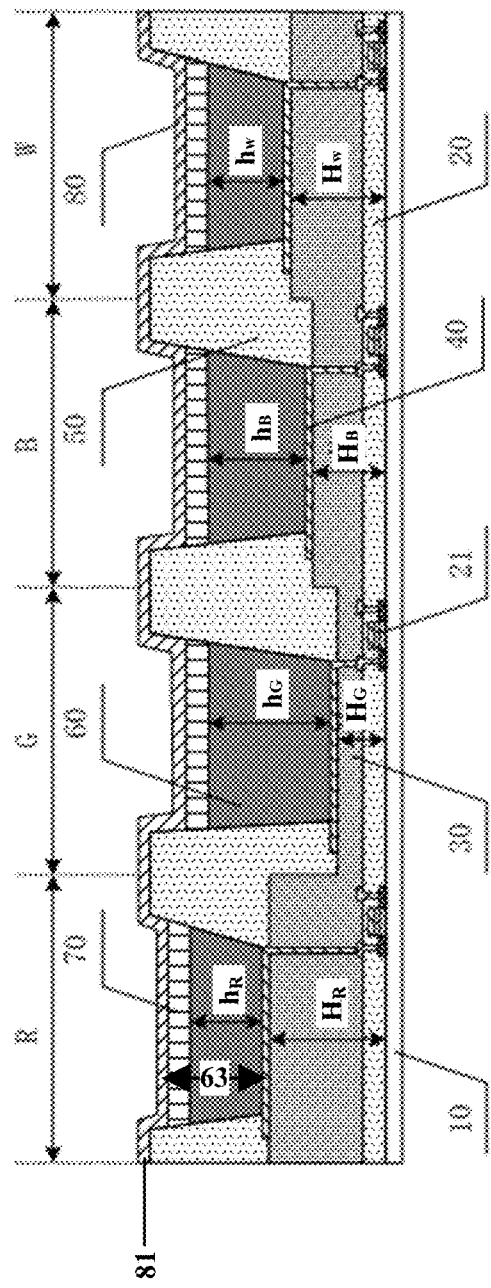
FIG. 10 is a schematic diagram illustrating that a second electrode is formed in some embodiments according to the present disclosure.

FIG. 10 is a schematic diagram illustrating that a second electrode is formed in some embodiments according to the present disclosure. Referring to FIG. 10, in some embodiments, a second electrode 80 is formed on a side of the hole injection layer 60 away from the first electrode 40. Optionally, the second electrode 80 is formed on a side of the light emission functional layer 70 away from the first electrode 40.

In some embodiments, a respective one of the plurality of organic light emitting diodes OLED includes a microcavity 63 formed using the first electrode 40 and the second electrode 80 as reflective mirrors. Optionally, lengths of the microcavity 63 and the thicknesses of the tuning layer 30 are negatively correlated among the subpixels of different colors.

In some embodiments, the organic light emitting diodes OLED have top emission structure. Optionally, the second electrode 80 is a transmissive electrode. Various appropriate materials may be used for making the transmissive electrode. Examples of materials suitable for making the transmissive electrode include, but are not limited to, magnesium (Mg), silver (Ag), aluminum (Al), copper (Cu), lithium (Li), and other metals. Optionally, the second electrode 80 is a transflective electrode. The transflective electrode can be formed using transflective metals.

Referring to FIG. 1A, in some embodiments, an encapsulating layer 90 is formed on a side of the second electrode 80 away from the base substrate 10. Various appropriate materials may be used for making the encapsulating layer 90. Examples of materials suitable for making the encapsulating layer 90 include, but are not limited to, tetrafluoroethylene TFE. Optionally, an orthographic projection of the encapsulating layer 90 on the base substrate 10 covers the base substrate 10.

In another aspect, the present disclosure provides a method of fabricating a display substrate having an array of a plurality of subpixels. In some embodiments, the method of fabricating a display substrate includes forming a pixel driving layer including a plurality of thin film transistors on a base substrate; forming a tuning layer on a side of the pixel driving layer away from the base substrate; and forming a plurality of organic light emitting diodes on a side of the tuning layer away from the pixel driving layer. Optionally, thicknesses of the tuning layer are formed differently in subpixels of different colors. Optionally, forming a respective one of the plurality of organic light emitting diodes includes forming a hole injection layer. Optionally, thicknesses of the hole injection layer are formed differently in subpixels of different colors. Optionally, the thicknesses of the tuning layer and the thicknesses of the hole injection layer are negatively correlated among the subpixels of different colors.

Referring to FIG. 2, forming a pixel driving layer having a plurality of thin film transistors 21 on a base substrate includes cleaning the base substrate 10, forming an active layer on a side of the base substrate 10 using patterning process, forming a first insulating layer on a side of the active layer away from the base substrate 10, forming a gate electrode and a gate line on a side of the first insulating layer away from the base substrate for a respective one of the plurality of subpixels; forming a second insulating layer on a side of the gate electrode and the gate line away from the base substrate for the respective one of the plurality of subpixels; forming a data line, a source electrode, and a drain electrode on a side of the second insulating layer away from the base substrate for the respective one of the plurality of subpixels.

Referring to FIG. 3 and FIG. 4, forming a tuning layer 30 on a side of the pixel driving layer 20 away from the base substrate 10 includes coating a tuning material layer on a side of the pixel driving layer 20 away from the base substrate 10; exposing the tuning material layer using a multi-tone mask plate shown in FIG. 4; developing the tuning material layer subsequent to exposing the tuning material layer, to form the tuning layer 30 having different thicknesses in the subpixels of different colors.

Optionally, the tuning layer 30 having different thicknesses in the subpixels of different colors is formed in a same patterning process using the multi-tone mask plate.

Optionally, the tuning layer 30 is formed so that a surface of the tuning layer 30 in a respective one of the plurality of subpixel apertures is substantially flat. Optionally, the tuning layer 30 is formed so that a surface of the tuning layer 30 in a respective one of the plurality of subpixel apertures is a stepped surface having one or a combination of one or more protrusions and one or more recesses. The stepped surface of the tuning layer 30 may effectively obviate the color shift issue and improve the display quality.

Optionally, prior to forming a tuning layer 30 on a side of the pixel driving layer 20 away from the base substrate 10 further, an insulating layer is formed on the pixel driving layer 20 to cover the gate line, the source electrode, and the drain electrode of a respective one of the plurality of thin film transistors 21 in the pixel driving layer 20.

Referring to FIG. 5, in some embodiments, forming the respective one of the plurality of organic light emitting diodes further includes forming a first electrode 40. Optionally, the first electrode 40 is formed between the tuning layer 30 and the hole injection layer. Optionally, the first electrode 40 is electrically connected to a respective one of the plurality of thin film transistors 21 through a via 31 extending through the tuning layer 30. Optionally, heights of the first electrode 40 relative to the base substrate are formed differently in the subpixels of different colors. Optionally, the heights of the first electrode 40 relative to the base substrate 01 and the thicknesses of the hole injection layer are negatively correlated among the subpixels of different colors.

Forming the first electrode 40 of a respective one of the plurality of organic light emitting diodes includes depositing a first metal material on a side of the tuning layer 30 away from the base substrate 10 to form a first metal material layer 41, and depositing the first metal material in the via 31; coating a photoresist on a side of the first metal material layer 41, exposing the photoresist using a mask plate; developing the first metal material layer 41 to form exposure areas and non-exposure areas; etching the exposure areas of the first metal material layer 41 to from the first electrode 40.

Referring to FIG. 6, in some embodiments, the method of fabricating a display substrate further includes forming a pixel definition layer 50 on a side of the tuning layer 30 away from the base substrate 10, to define a plurality of subpixel apertures 51. Optionally, a surface of the pixel definition layer 50 away from the base substrate 10 is formed to have a substantially same height relative to a main surface of the base substrate 10 throughout the plurality of subpixels SP. Optionally, heights of the pixel definition layer 50 relative to a surface of the tuning layer 30 away from the base substrate 10 are formed differently in the subpixels of different colors. Optionally, the thicknesses H of the tuning layer 30 and the heights $H_P$ of the pixel definition layer 50 relative to the surface of the tuning layer 30 are negatively correlated among the subpixels of different colors.

Forming a pixel definition layer 50 on a side of the tuning layer 30 away from the base substrate 10 includes coating a pixel definition material layer 52 on a side of the first electrode 40 away from the base substrate 10; exposing the pixel definition material layer 52 using a mask plate; developing the pixel definition material layer 52 to exposing partial of the pixel definition material layer 52; and forming the pixel definition layer 50 by etching the pixel definition material layer 52.

In some embodiments, forming a respective one of the plurality of organic light emitting diodes includes forming a hole injection layer on a side of the first electrode away from the base substrate.

Various methods may be used for forming the hole injection layer. Examples of methods suitable for forming the hole injection layer includes a combination of coating a hole injection material solution and drying the hole injection material solution to form the hole injection layer; a combination of vapor depositing a hole injection material layer and planarizing a surface of the hole injection material layer to form the hole injection layer. Optionally, planarizing the surface of the hole injection material layer includes polishing the surface of the hole injection material layer, and applying thermal reflux on the surface of the hole injection material layer.

Referring to FIG. 7 and FIG. 6, forming the hole injection layer includes coating a hole injection material solution 61 to fill the plurality of subpixel apertures 51. Optionally, the hole injection material solution 61 covers the pixel definition layer 50. Optionally, a height of the hole injection material solution 61 relative to a surface of the tuning layer away from the base substrate 10 is greater than the heights $H_P$ of the pixel definition layer relative to the surface of the tuning layer 30 away from the base substrate 10. Optionally, an orthographic projection of the hole injection material solution 61 on the base substrates covers the tuning layer 30.

Referring to FIG. 7 and FIG. 8, in some embodiments, forming the hole injection layer 60 includes drying the hole injection material solution 61 to form the hole injection layer 60 having different thicknesses in subpixels of different colors. Optionally, the hole injection layer 60 in a respective one of the plurality of subpixel apertures 51 is in direct contact with a first electrode 40 in one of the plurality of subpixels SP.

The surface of the pixel definition layer 50 formed using coating process has a flat surface, so the surface of the pixel definition layer 50 away from the base substrate 10 has a substantially same height relative to a main surface of the base substrate 10 throughout the plurality of subpixels SP. A first electrode 40 in a respective one of the plurality subpixels is formed on a side of the tuning layer 30 away from the base substrate 10. Because the thicknesses of the tuning layer 30 are different in subpixels of different colors. In subpixels of different colors, a height of the pixel definition layer 50 relative to a first electrode 40 in a respective one of subpixels of different colors is different from a height of the pixel definition layer 50 relative to a first electrode 40 in a different color subpixel of subpixels of different colors. The amounts of hole injection material solution 61 filled in different ones of the subpixels of different colors are different.

The hole injection material solution 61 in the plurality of subpixels SP has the same concentration. Subsequent to a drying process, the solvent of the hole injection material solution 61 evaporates, a respective one of the plurality of subpixels SP having a greater amount of hole injection material solution 61 has a thicker hole injection layer 60; a respective one of the plurality of subpixels SP having a smaller amount of hole injection material solution 61 has a thinner hole injection layer 60.

In some embodiments, the thickness $H_R$ of the tuning layer 30 in the red subpixel R is greater than the thickness $H_W$ of the tuning layer in the white subpixel W. The height $H_{PR}$ of the pixel definition layer 50 relative to a surface of the tuning layer 30 away from the base substrate 10 in the red subpixel R is less than the height $H_{PW}$ of the pixel definition layer 50 relative to a surface of the tuning layer 30 away from the base substrate 10 in the white subpixel W. An amount of hole injection material solution 61 in the red subpixel R is less than an amount of hole injection material solution 61 in the white subpixel W. So, the thickness $h_R$ of the hole injection layer 60 in the red subpixel R is less than the thickness $h_W$ of the hole injection layer 60 in the white subpixel W.

The thickness $H_W$ of the tuning layer 30 in the white subpixel W is greater than the thickness $H_B$ of the tuning layer 30 in the blue subpixel B. The height $H_{PW}$ of the pixel definition layer 50 relative to a surface of the tuning layer 30 away from the base substrate 10 in the white subpixel W is less than the height $H_{PB}$ of the pixel definition layer 50 relative to the surface of the tuning layer 30 away from the base substrate 10 in the blue subpixel B. An amount of hole injection material solution 61 in the white subpixel W is less than an amount of hole injection material solution 61 in the blue subpixel B. So, the thickness $h_W$ of the hole injection layer 60 in the white subpixel W is less than the thickness $h_B$ of the hole injection layer 60 in the blue subpixel B.

The thickness $H_B$ of the tuning layer 30 in the blue subpixel B is greater than the thickness $H_G$ of the tuning layer in the green subpixel G. The height $H_{PB}$ of the pixel definition layer 50 relative to a surface of the tuning layer 30 away from the base substrate 10 in the blue subpixel R is smaller than a height $H_{PG}$ of the pixel definition layer 50 relative to a surface of the tuning layer 30 away from the base substrate 10 in the green subpixel G. The thickness $h_B$ of the hole injection layer 60 in the blue subpixel B is less than the thickness $h_G$ of the hole injection layer 60 in the green subpixel G. An amount of hole injection material solution 61 in the blue subpixel B is less than an amount of hole injection material solution 61 in the green subpixel G. So, the thickness $h_B$ of the hole injection layer 60 in the blue subpixel B is less than a thickness $h_G$ of the hole injection layer 60 in the green subpixel G.

Figure 11:
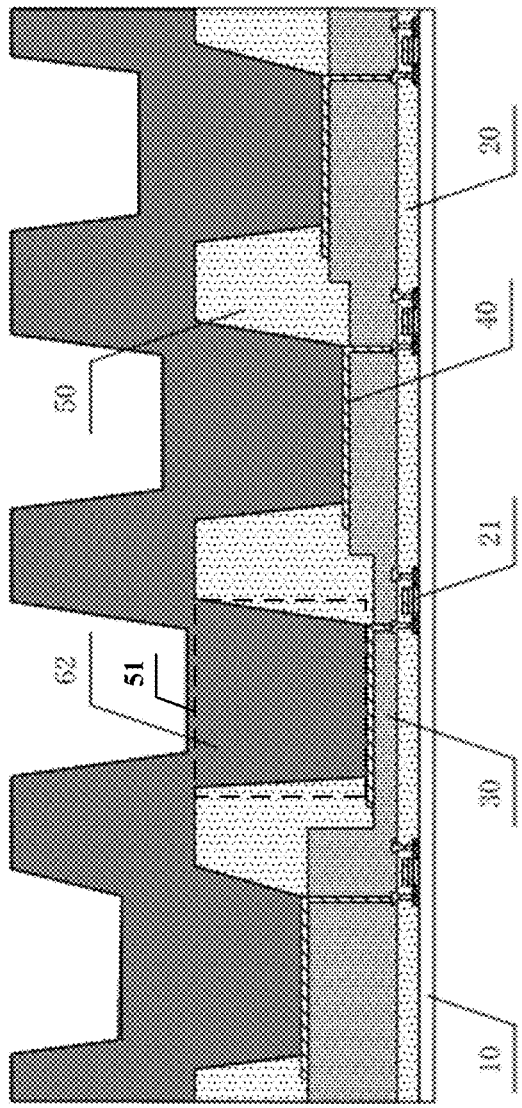
FIG. 11 is a schematic diagram illustrating that a hole injection material layer is filled in the plurality of subpixel apertures using vapor deposition in some embodiments according to the present disclosure.

In some embodiments, the thicknesses h of the hole injection layer 60 and the heights of the pixel definition layer 50 relative to a surface of the tuning layer 30 away from the base substrate 10 are correlated among the subpixels of different. Correlation mentioned herein includes not only the perfect correlation. The correlation refers to a relationship between two variables in which one variable increases as the other variable increases. For example, the heights of the pixel definition layer 50 increases as the thickness of the hole injection layer 60 increases. For example, if $H_{PR} < H_{PW} < H_{PB} < H_{PG}$, $h_R < h_W < h_B < h_G$, In some embodiments, the thicknesses of the hole injection layer 60 and the thicknesses of the tuning layer 30 are negatively correlated among the subpixels of different. For example, as the thicknesses of the tuning layer 30 decreases, the thicknesses of the hole injection layer 60 increases, e.g. if $H_R > H_W > H_B > H_G$, $h_R < h_W < h_B < h_G$, FIG. 11 is a schematic diagram illustrating that a hole injection material layer is filled in the plurality of subpixel apertures using vapor deposition in some embodiments according to the present disclosure. Referring to FIG. 11, in some embodiments, forming the hole injection layer includes vapor depositing the hole injection material layer 62 to fill the plurality of subpixel apertures 51 defined by the pixel definition layer 50.

Figure 12:
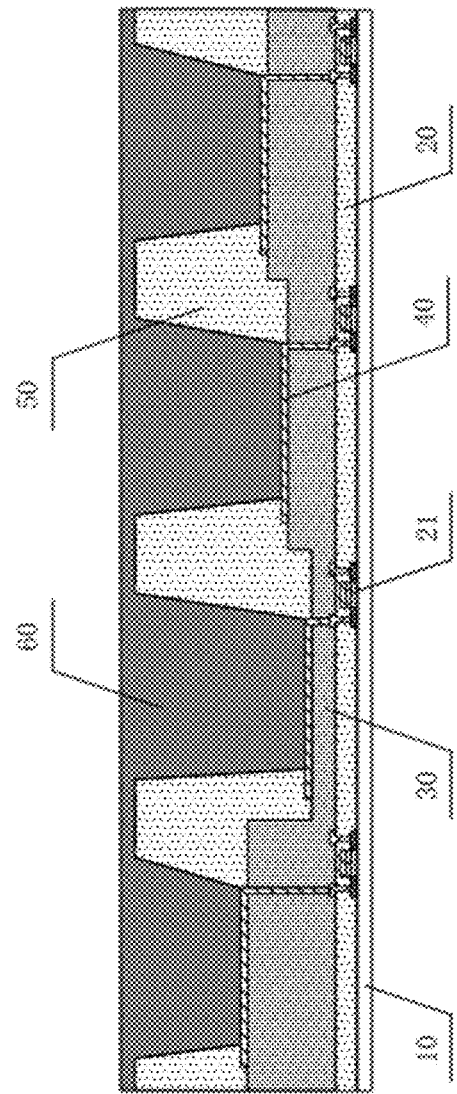
FIG. 12 is a schematic diagram illustrating a surface of the hole injection material layer is planarized by polishing in some embodiments according to the present disclosure.

FIG. 12 is a schematic diagram illustrating a surface of the hole injection material layer is planarized by polishing in some embodiments according to the present disclosure. Referring to FIG. 12, forming the hole injection layer includes planarizing a surface of the hole injection material layer 62 by polishing, to form the hole injection layer 60 having different thicknesses in subpixels of different colors.

FIG. 13 is a schematic diagram illustrating a surface of the hole injection material layer is planarized by thermal reflux in some embodiments according to the present disclosure. Referring to FIG. 13, in some embodiments, subsequent to vapor depositing the hole injection material layer 62 to fill the plurality of subpixel apertures 51 defined by the pixel definition layer 50, forming the hole injection layer includes planarizing a surface of the hole injection material layer 62 by applying thermal reflux, to form the hole injection layer 60 having different thicknesses in subpixels of different colors.

In some embodiments, using polishing or thermal reflux to planarizing the surface of the hole injection material layer 62, the hole injection layer 60 having a flat surface is formed. The surface of the hole injection layer 60 away from the base substrate 10 has a substantially same height relative to the surface of the base substrate 10. The thicknesses H of the tuning layer 30 are different in subpixels of different colors, resulting that the heights of the first electrode 40 relative to the base substrate 10 are different in the subpixels of different colors. So, the thicknesses h of the hole injection layer 60 are different in the subpixels of different colors.

Optionally, the thickness H of the tuning layer 30 and the thickness h of the hole injection layer 60 are negatively correlated among the subpixels of different colors.

Using the method combining coating and polishing the hole injection material layer 62, or the method combining coating and applying thermal reflux to the hole injection material layer 62, the accuracy of the method of fabricating the display substrate herein can be improved. In addition, the coating process, the polishing process, and the thermal reflux process are mature processes.

Referring to FIG. 9, in some embodiments, forming a respective one of the plurality of organic light emitting diodes OLED includes forming a light emission functional layer 70 on a side of the hole injection layer 60 away from the base substrate 10.

Optionally, the light emission functional layer 70 includes a light emission layer (EML). Optionally, the light emission functional layer 70 includes an electron transport layer (ETL), and a hold transport layer (HTL). Optionally, the light emission functional layer 70 includes an electron injection layer (EIL) between the electron transport layer and a second electrode to improve the efficiency of injecting electrons and holes into the light emission layer. For example, the hold transport layer (HTL), the light emission layer (EML), the electron transport layer (ETL), and the electron injection layer (EIL) are sequentially disposed on a side of the hole injection layer 60 away from the base substrate 10.

Referring to FIG. 10, in some embodiments, forming the respective one of the plurality of organic light emitting diodes OLED further includes forming a second electrode 80 on a side of the hole injection layer 60 away from the first electrode 40 to form a microcavity 63 in the respective one of the plurality of organic light emitting diodes OLED using the first electrode 40 and the second electrode 80 as reflective mirrors. Optionally, lengths of the microcavity 63 and the thicknesses of the tuning layer 30 are negatively correlated among the subpixels of different colors.

In some embodiments, forming the second electrode 80 includes forming a second metal film 81 on a side of the hole injection layer 60 away from the first electrode 40; patterning the second metal film 81 to form the second electrode 80. Optionally, forming the second electrode 80 includes forming a second metal film 81 on a side of the light emission functional layer 70 away from the first electrode 40.

Referring to FIG. 1A, forming the display substrate further includes forming an encapsulating layer 90 on a side of the second electrode 80 away from the base substrate 10. Forming the encapsulating layer 90 includes coating an organic material layer on a side of the second electrode 80 away from the base substrate 10 to form the encapsulating layer 90 to protect the display substrate. Optionally, an orthographic projection of the encapsulating layer 90 on the base substrate 10 covers the base substrate 10.

In some embodiments, by forming the tuning layer 30 between the pixel driving layer 20 and the plurality of organic light emitting diodes OLED, the thicknesses h of the hole injection layer 60 in a respective one of the plurality of subpixels SP can be determined by the thicknesses H of the tuning layer 30. The lengths of the microcavity can be determined by the thicknesses h of the hole injection layer 60. The microcavity has a simple structures, and the cost of forming the microcavity is low. The method for forming the microcavity is relatively accurate, and easy to be performed, which solves the problems of high production cost and low yield rate using a conventional method. In addition, the display substrate herein can be formed using the existing mature methods, which may avoid using the Fine Metal Mask (FMM), and the inject printing. The method for fabricating a display substrate herein is simple, and has high production efficiency, low production cost, and high yield.

In some embodiment, the method for fabricating a display substrate herein can also be used to form a bottom-emitting OLED or a double-sided emitting OLED.

In another aspect, the present disclosure also provides a display panel. Optionally, the display panel includes the display substrate as described herein, and a counter substrate facing the display substrate.

In another aspect, the present disclosure also provides a display apparatus. Optionally, the display apparatus includes the display panel as described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having an array of a plurality of subpixels, comprising:
   a base substrate;
   a pixel driving layer comprising a plurality of thin film transistors on the base substrate;
   a tuning layer on a side of the pixel driving layer away from the base substrate, thicknesses of the tuning layer being different in subpixels of different colors;
   a plurality of organic light emitting diodes on a side of the tuning layer away from the pixel driving layer; and
   a pixel definition layer on a side of the tuning layer away from the base substrate, and defining a plurality of subpixel apertures;
   wherein a respective one of the plurality of organic light emitting diodes comprises a hole injection layer, thicknesses of the hole injection layer being different in subpixels of different colors;
   the thicknesses of the tuning layer and the thicknesses of the hole injection layer are negatively correlated among the subpixels of different colors;
   a surface of the pixel definition layer away from the base substrate has a substantially same height relative to a main surface of the base substrate throughout the plurality of subpixels;
   heights of the pixel definition layer relative to a surface of the tuning layer away from the base substrate are different in the subpixels of different colors; and
   the thicknesses of the tuning layer and the heights of the pixel definition layer relative to the surface of the tuning layer are negatively correlated among the subpixels of different colors.

2. The display substrate of claim 1, wherein the respective one of the plurality of organic light emitting diodes further comprises a first electrode between the tuning layer and the hole injection layer;
   the first electrode is electrically connected to a respective one of the plurality of thin film transistors through a via extending through the tuning layer.

3. The display substrate of claim 2, wherein heights of the first electrode relative to the base substrate being different in the subpixels of different colors;
   and the heights of the first electrode relative to the base substrate and the thicknesses of the hole injection layer are negatively correlated among the subpixels of different colors.

4. The display substrate of claim 2, wherein the respective one of the plurality of organic light emitting diodes further comprises a second electrode on a side of the hole injection layer away from the first electrode;
   a microcavity in the respective one of the plurality of organic light emitting diodes is formed using the first electrode and the second electrode as reflective mirrors; and
   lengths of the microcavity and the thicknesses of the tuning layer are negatively correlated among the subpixels of different colors.

5. The display substrate of claim 1, wherein a surface of the tuning layer in a respective one of the plurality of subpixel apertures is substantially flat.

6. The display substrate of claim 1, wherein a surface of the tuning layer in a respective one of the plurality of subpixel apertures is a stepped surface having one or a combination of one or more protrusions and one or more recesses.

7. The display substrate of claim 1, wherein the subpixels of different colors comprise a red subpixel, a green subpixel, a blue subpixel, and a white subpixel;
   a thickness of the tuning layer in the red subpixel is greater than a thickness of the tuning layer in the white subpixel;
   a thickness of the tuning layer in the white subpixel is greater than a thickness of the tuning layer in the blue subpixel;
   a thickness of the tuning layer in the blue subpixel is greater than a thickness of the tuning layer in the green subpixel;
   a thickness of the hole injection layer in the red subpixel is less than a thickness of the hole injection layer in the white subpixel;
   a thickness of the hole injection layer in the white subpixel is less than a thickness of the hole injection layer in the blue subpixel; and
   a thickness of the hole injection layer in the blue subpixel is less than a thickness of the hole injection layer in the green subpixel.

8. A display apparatus, comprising the display substrate of claim 1, and one or more integrated circuits connected to the display substrate.

9. A method of fabricating a display substrate having an array of a plurality of subpixels, comprising:
   forming a pixel driving layer comprising a plurality of thin film transistors on a base substrate;
   forming a tuning layer on a side of the pixel driving layer away from the base substrate, thicknesses of the tuning layer being formed differently in subpixels of different colors;
   forming a plurality of organic light emitting diodes on a side of the tuning layer away from the pixel driving layer; and
   forming a pixel definition layer on a side of the tuning layer away from the base substrate, to define a plurality of subpixel apertures;
   wherein forming a respective one of the plurality of organic light emitting diodes comprises forming a hole injection layer, thicknesses of the hole injection layer being formed differently in subpixels of different colors;
   the thicknesses of the tuning layer and the thicknesses of the hole injection layer are negatively correlated among the subpixels of different colors
   a surface of the pixel definition layer away from the base substrate is formed to have a substantially same height relative to a main surface of the base substrate throughout the plurality of subpixels;
   heights of the pixel definition layer relative to a surface of the tuning layer away from the base substrate are formed differently in the subpixels of different colors; and
   the thicknesses of the tuning layer and the heights of the pixel definition layer relative to the surface of the tuning layer are negatively correlated among the subpixels of different colors.

10. The method of claim 9, wherein the tuning layer having different thicknesses in the subpixels of different colors is formed in a same patterning process using a multi-tone mask plate.

11. The method of claim 10, wherein forming a tuning layer comprises:
    coating a tuning material layer on side of the pixel driving layer away from the base substrate;

exposing the tuning material layer using the multi-tone mask plate;

developing the tuning material layer subsequent to exposing the tuning material layer, thereby forming the tuning layer having different thicknesses in the subpixels of different colors.

12. The method of claim 9, wherein the tuning layer is formed so that a surface of the tuning layer in a respective one of a plurality of subpixel apertures is substantially flat.

13. The method of claim 9, wherein the tuning layer is formed so that a surface of the tuning layer in a respective one of a plurality of subpixel apertures is a stepped surface having one or a combination of one or more protrusions and one or more recesses.

14. The method of claim 9, wherein forming the hole injection layer comprises:

coating a hole injection material solution to fill the plurality of subpixel apertures; and drying the hole injection material solution, thereby forming the hole injection layer having different thicknesses in subpixels of different colors.

15. The method of claim 9, wherein forming the hole injection layer comprises:

vapor depositing a hole injection material layer to fill the plurality of subpixel apertures; and planarizing a surface of the hole injection material layer by polishing or thermal reflux, thereby forming the hole injection layer having different thicknesses in subpixels of different colors.

16. The method of claim 9, wherein forming the respective one of the plurality of organic light emitting diodes further comprises forming a first electrode, the first electrode formed between the tuning layer and the hole injection layer and electrically connected to a respective one of the plurality of thin film transistors through a via extending through the tuning layer;

heights of the first electrode relative to the base substrate are formed differently in the subpixels of different colors; and the heights of the first electrode relative to the base substrate and the thicknesses of the hole injection layer are negatively correlated among the subpixels of different colors.

17. The method of claim 16, wherein forming the respective one of the plurality of organic light emitting diodes further comprises forming a second electrode on a side of the hole injection layer away from the first electrode, thereby forming a microcavity in the respective one of the plurality of organic light emitting diodes using the first electrode and the second electrode as reflective mirrors; and lengths of the microcavity and the thicknesses of the tuning layer are negatively correlated among the subpixels of different colors.

* * * * *